US009172211B2

United States Patent
Kuksenkov et al.

(10) Patent No.: US 9,172,211 B2
(45) Date of Patent: Oct. 27, 2015

(54) HEATING ELEMENTS FOR MULTI-WAVELENGTH DBR LASER

(75) Inventors: Dmitri Vladislavovich Kuksenkov, Big Flats, NY (US); Shenping Li, Painted Post, NY (US); Hong Ky Nguyen, Painted Post, NY (US); Chung-En Zah, Holmdel, NJ (US)

(73) Assignee: Thorlabs Quantum Electronics, Inc., Jessup, MD (US)

( * ) Notice: Subject to any disclaimer, the term of this patent is extended or adjusted under 35 U.S.C. 154(b) by 412 days.

(21) Appl. No.: 13/292,385

(22) Filed: Nov. 9, 2011

(65) Prior Publication Data

US 2013/0114635 A1    May 9, 2013

(51) Int. Cl.
H01S 5/00 (2006.01)
H01S 5/06 (2006.01)
H01S 5/125 (2006.01)
H01S 5/026 (2006.01)
H01S 5/10 (2006.01)
H01S 5/12 (2006.01)

(52) U.S. Cl.
CPC ............ *H01S 5/0612* (2013.01); *H01S 5/0261* (2013.01); *H01S 5/1096* (2013.01); *H01S 5/125* (2013.01); *H01S 5/1209* (2013.01)

(58) Field of Classification Search
CPC ... H01S 5/0612; H01S 5/06256; H01S 5/141; H01S 5/026; H01S 5/125; H01S 5/0261; H01S 5/1209; H01S 5/187; H01S 3/0675; H01S 5/06258; H01S 5/1096; H01S 5/06804
USPC .............................. 372/34, 43.01, 50.1, 50.11
See application file for complete search history.

(56) References Cited

U.S. PATENT DOCUMENTS

| 5,459,799 | A | * | 10/1995 | Weber | 385/2 |
| 5,642,371 | A | * | 6/1997 | Tohyama et al. | 372/45.01 |
| 6,018,540 | A | * | 1/2000 | Kinoshita | 372/46.01 |
| 6,122,306 | A | * | 9/2000 | Sartorius et al. | 372/96 |
| 6,940,878 | B2 | * | 9/2005 | Orenstein et al. | 372/20 |
| 7,486,709 | B2 | * | 2/2009 | Hu et al. | 372/34 |
| 7,567,595 | B2 | | 7/2009 | Hu et al. | |
| 7,760,777 | B2 | | 7/2010 | Matsui et al. | |
| 8,311,068 | B2 | * | 11/2012 | Shibata et al. | 372/20 |

(Continued)

OTHER PUBLICATIONS

Roh et al.; "Dual-Wavelength InGaAs—GaAs Ridge Waveguide Distributed Bragg Reflector Lasers With Tunable Mode Separation"; IEEE Photonics Technology Letters; vol. 12, No. 10; Oct. 2000.

(Continued)

*Primary Examiner* — Colleen A Matthews
*Assistant Examiner* — Delma R Forde
(74) *Attorney, Agent, or Firm* — Graham Curtin, P.A.

(57) ABSTRACT

A multi-wavelength distributed Bragg reflector (DBR) semiconductor laser is provided where DBR heating elements are positioned over the waveguide in the DBR section and define an interleaved temperature profile that generates multiple distinct reflection peaks corresponding to distinct temperature dependent Bragg wavelengths associated with the temperature profile. Neighboring pairs of heating elements of the DBR heating elements positioned over the waveguide in the DBR section are spaced along the direction of the axis of optical propagation by a distance that is equal to or greater than the laser chip thickness b to minimize the impact of thermal crosstalk between distinct temperature regions of the interleaved temperature profile.

20 Claims, 2 Drawing Sheets

(56) References Cited

U.S. PATENT DOCUMENTS

| | | | |
|---|---|---|---|
| 2004/0228384 | A1 | 11/2004 | Oh et al. |
| 2005/0018732 | A1* | 1/2005 | Bond et al. ........................ 372/50 |
| 2008/0025355 | A1* | 1/2008 | Hu et al. ........................... 372/34 |
| 2008/0279234 | A1 | 11/2008 | Gollier et al. |
| 2009/0041073 | A1 | 2/2009 | Matsui et al. |
| 2009/0074020 | A1* | 3/2009 | Matsui et al. .................... 372/34 |
| 2010/0260215 | A1 | 10/2010 | Nguyen et al. |
| 2010/0279447 | A1 | 11/2010 | Matsui et al. |
| 2011/0286477 | A1 | 11/2011 | Kuksenkov et al. |
| 2013/0182728 | A1* | 7/2013 | Li ...................................... 372/20 |

OTHER PUBLICATIONS

Kameda et al., "A DBR Laser Employing Passive-Section Heaters, with 10.8 nm Tuning Range and 1.6 MHz Linewidth", IEEE 1041-1135, pp. 608-610, 1993.

Lio et al., "Two-Longitudinal-Mode Laser Diodes", IEEE Photonics Technology Lettesr, vol. 7, No. 9, pp. 959-961, Sep. 1995.

Chen et al., "Photonic generation of a microwave signal by incorporating a delay interferometer and a saturable absorber", Opt. Lett., vol. 33, No. 6, pp. 554-556, Mar. 15, 2008.

Davies et al., "The development of terahertz sources and their applications", Phys. Med. Biol., vol. 47, pp. 3679-3689, 2002.

Hidaka et al., "CW terahertz wave generation by photomixing using a two longitudinal-mode laser diode", Electron Lett. vol. 33, pp. 3039-2040, 1997.

Chernikov et al., "Generation of Soliton Pulse Train in Optical Fiber Using Two CW Single-mode Diode Lasers", Electron. Lett. vol. 28, pp. 931, 1992.

Gelmini et al., "Tunable, double wavelength heterodyne detection interferometer for absolute distance measurements", Opt. Lett. vol. 19, pp. 213-215, 1994.

Hadeler et al., "Polarimetric fiber distributed feedback laser sensor for simultaneous strain and temperature measurements", Appl. Opt. vol. 38, pp. 1953, 1999.

Roh et al., "Dual-wavelength asymmetric cladding InGaAs—GaAs ridge waveguide distributed Bragg reflector lasers", IEEE Photon. Technol. Lett., vol. 11, No. 1, pp. 15-17, Jan. 1999.

Matsui et al., "Beat frequency generation up to 3.4THz from simultaneous two-mode lasing operation of sampled-grating DBR laser", Electron. Lett. vol. 35, No. 6, pp. 472-473, Mar. 18, 1999.

Talneau et al., "Multiple distributed feedback operation at 1.55_m with uniform output powers in a single laser diode", App. Phys. Lett., vol. 75, No. 5, pp. 600-602, Aug. 2, 1999.

Pozzi et al., "Dual-wavelength InAlGaAs—InP laterally coupled distributed feedback laser", IEEE Photon. Technol. Lett., vol. 18, No. 24, pp. 2563-2565, Dec. 2006.

Chow et al., "Theory of semiconductor quantum-dot laser dynamics", IEEEE J. Quantum Electron., vol. 41, No. 4, pp. 495-505, Apr. 2005.

Woodward et al., "A DBR Laser tunable by resistive heating", IEEE Photon. Technol. Lett., vol. 4, No. 12, pp. 1330-1332, Dec. 1992.

\* cited by examiner

HEATING ELEMENTS FOR MULTI-WAVELENGTH DBR LASER

BACKGROUND

The present disclosure relates to semiconductor lasers characterized by multi-wavelength emission and, more particularly, to multi-wavelength distributed Bragg reflector (DBR) lasers. The concepts of the present disclosure will enjoy broad applicability in a variety of fields where multi-wavelength lasers are used.

BRIEF SUMMARY

The present disclosure is directed to multi-wavelength DBR lasers that can be operated to generate several wavelengths simultaneously in time. Multiple-wavelength lasers have attracted considerable attention because of their many important applications including, but not limited to, their use in high-power, speckle-reduced synthetic green lasers. High-power multiple-wavelength semiconductor DBR lasers may also be attractive for other existing and yet to be developed applications in various fields, such as optical communication, optical measurements, data processing, and remote sensing. High-power multiple-wavelength semiconductor DBR lasers can also be used in the photonic generation of microwave signals, which can be used in the areas of radio-over-fiber networks, broadband wireless access, radar, and sensor networks.

Another important application of multi-wavelength lasers is terahertz (THz) wave generation, which is interesting for the fields of spectroscopy, imaging, communications, signal processing, and quantum information. Dual-wavelength diode lasers are good candidates for THz wave generation because of they tend to be compact, relatively low cost, and highly reliable. Some other applications of dual-wavelength lasers include soliton pulse train generation for ultrahigh-speed optical communications and signal processing, heterodyne interferometry for distance measurement, and optical sensing.

In accordance with one embodiment of the present disclosure, a multi-wavelength distributed Bragg reflector (DBR) semiconductor laser is provided. DBR heating elements are positioned over the waveguide in the DBR section and are spaced in succession along the axis of optical propagation by an intra-grating spacing d to define one or more thermally active grating portions in the DBR section and one or more thermally passive grating portions in the DBR section. The thermally active grating portions define a temperature dependent Bragg wavelength that is a function of the grating period of the thermally active grating portions. The thermally passive grating portions define a temperature dependent Bragg wavelength that is a function of the grating period of the thermally passive grating portions. The intra-grating spacing d is approximately the same order of magnitude as the laser chip thickness b.

In accordance with another embodiment of the present disclosure, a multi-wavelength distributed Bragg reflector (DBR) semiconductor laser is provided where DBR heating elements are positioned over the waveguide in the DBR section and define an interleaved temperature profile that generates multiple distinct reflection peaks corresponding to distinct temperature dependent Bragg wavelengths associated with the temperature profile. Neighboring pairs of heating elements of the DBR heating elements positioned over the waveguide in the DBR section are spaced along the direction of the axis of optical propagation by a distance that is equal to or greater than the laser chip thickness b to minimize the impact of thermal crosstalk between distinct temperature regions of the interleaved temperature profile.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
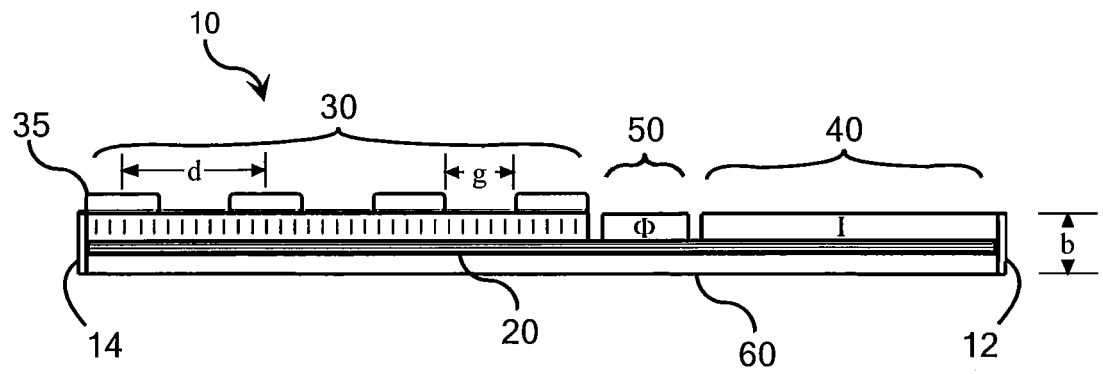
FIG. 1 is a schematic illustration of a multi-wavelength distributed Bragg reflector (DBR) laser according to the present disclosure.

The general structure of a multi-wavelength DBR laser 10 according to the present invention is illustrated schematically in FIG. 1, and is not necessarily drawn to scale. In FIG. 1, the DBR laser 10 comprises a waveguide 20 defining an axis of optical propagation, a wavelength selective DBR section 30, a plurality of DBR heating elements 35, a gain section 40, an optional passive phase section 50, and a laser substrate 60. The waveguide 20 generally extends between the front and rear facets 12, 14 of the laser 10. Typically, the passive phase section 50 is not used if the DBR laser is operated in a pulsed mode.

As will be appreciated by those familiar with DBR lasers, a DBR section of a DBR laser comprises a Bragg grating, i.e., a light-reflecting device based on Bragg reflection by a periodic structure. The periodic structure of the DBR section defines a temperature dependent Bragg wavelength $\lambda B$. The present disclosure is directed to the particulars of the DBR heating elements and the DBR section 30. The respective structures of the waveguide 20, which includes a single or multi-component core and associated waveguide layers, the gain and phase sections 40, 50, and the anti-reflection coatings of the front and rear facets 12, 14 can be gleaned from readily available teachings in the art. For example, it is noted that the front facet 12 should be provided with a coating with reflectivity greater than approximately 1%. The waveguide 20 of the laser 10 may comprise a uni-polar stack of quantum cascade cores or a single quantum cascade core. Alternatively, the waveguide core may comprise a bi-polar configuration using inter-band transitions to produce photons, as opposed to the inter-sub-band transitions of uni-polar cores.

The DBR section 30 comprises a wavelength selective grating section defining a given grating period A corresponding to a temperature dependent Bragg wavelength $\lambda_B$. As is illustrated schematically in FIGS. 1 and 2, the DBR heating elements 35 are restricted to the DBR section 30 and comprise interdigital heating element control nodes configured for bi-directional heating current flow in individual ones of the DBR heating elements 35. The DBR heating elements 35 are positioned over the waveguide 20 in the DBR section 30 and are spaced in succession along the axis of optical propagation by an intra-grating spacing d. The DBR heating elements 35, spaced in this manner, define thermally active and thermally passive grating portions in the DBR section 30. These grating portions are delineated with the reference characters $T_1$ and $T_2$ in FIG. 2. It is noted that the term "over" is utilized herein to cover instances where the heating elements 35 are formed in the DBR section, directly on the DBR section, on intervening layers that overlie the DBR section, or in intervening layers that overlie the DBR section.

The thermally active grating portions $T_1$ define a temperature dependent Bragg wavelength that is a function temperature and the associated DBR grating period. Similarly, the thermally passive grating portions $T_2$ define another temperature dependent Bragg wavelength that is a function of temperature and the associated DBR grating period. In operation, electrical current flowing through the heating elements 35, e.g., a heavily doped p-type semiconductor contact layer, will add heat to the associated DBR grating portion and will increase the temperature of the underlying active grating portion $T_1$. These temperature increases can be used to control spectral shifts of the Bragg grating to longer wavelengths. It is also contemplated that the heating elements can be used to regulate temperature by controlling the amount of heat added to the laser if a supplemental laser cooling source is provided. Accordingly, the heating elements can be described as a means for also controlling the spectral shifts of the Bragg grating to shorter wavelengths. If the heating elements 35 are properly spaced and separated, significant differences in thermally-induced Bragg wavelength shifts can be generated in the thermally active and thermally passive grating portions $T_1$, $T_2$ in the DBR section 30. The result of this periodic heating, which creates DBR grating portions with different refractive-indices, is a DBR section capable of generating two substantially equal-amplitude reflection peaks. As a result, dual-wavelength emission can be achieved.

It is contemplated that the separation between the resulting emission lines of the laser diode 10 can be adjusted by controlling the heat density in the DBR section 30. The resistance of each heating element 35 can be tailored by changing the distance between the voltage control nodes that supply current to the individual heating elements 35. The respective emission lines can also be tuned by changing the heater current. All of the aforementioned tuning techniques can be particularly useful in the context of synthetic green laser sources where the emission lines of an IR DBR laser can be matched with the conversion efficiency peaks of a nonlinear crystal or other wavelength conversion device. Finally, it is noted that the heating element polarity illustrated in FIG. 2 and the remaining drawings is presented for illustrative purposes only and can be reversed or tailored to meet the needs of a variety of applications of the technology disclosed herein.

Figure 2:
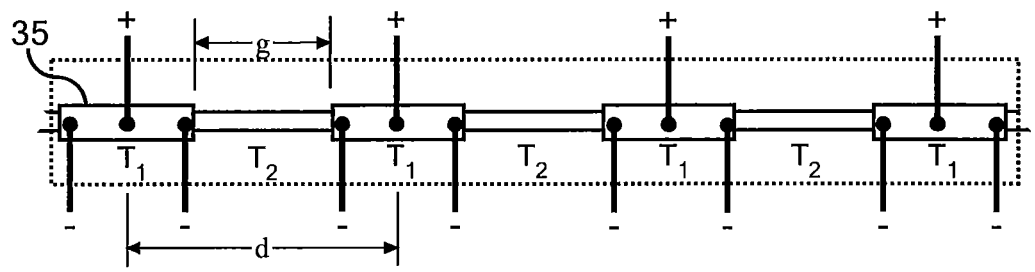
FIGS. 2-5 illustrate alternative heating element configurations for use in a DBR laser according to the present disclosure.

FIGS. 1 and 2 illustrate that different layers of the wavelength selective DBR section 30, including the waveguide 20 and the laser substrate 60 contribute to define the laser chip thickness b. Preferably, the intra-grating spacing d is approximately the same order of magnitude as the laser chip thickness b. The resulting structure can be described as defining an interleaved temperature profile that generates multiple distinct reflection peaks corresponding to distinct temperature dependent Bragg wavelengths associated with the temperature profile. Neighboring pairs of heating elements 35 are spaced a distance that is equal to or greater than the laser chip thickness b to minimize the impact of thermal crosstalk between distinct temperature regions of the interleaved temperature profile.

In particular embodiments, the intra-grating spacing d is at least as large as the laser chip thickness b. FIGS. 1 and 2 further illustrate that the DBR heating elements 35 are separated along the axis of optical propagation by an intra-grating gap g that is preferably less than the laser chip thickness b and the intra-grating spacing d, e.g., about two-thirds of the laser chip thickness b. In more specific embodiments, it may be preferable to ensure that the intra-grating gap g is approximately 70% to approximately 75% of the intra-grating spacing d.

By way of illustration, and not limitation, it is contemplated that, where the wavelength selective DBR section 30 defines a DBR length of between approximately 0.5 mm and approximately 0.52 mm, the intra-grating spacing d will be between approximately 148 µm and approximately 150 µm, while the intra-grating gap g will be between approximately 104 µm and approximately 110 µm.

In one embodiment, DBR interdigital heating elements are integrated over the DBR section waveguide of a semiconductor DBR laser. The heating elements are separated at a distance comparable to or greater than the laser chip thickness. Stable dual-wavelength emission under CW operation at 25° C. has been achieved using a DBR laser with a four-section inter-digital heater configuration similar to that illustrated in FIG. 2. The two single-wavelength peaks are separated by 1.39 nm at 1059.5 and 1060.89 nm with side-mode suppression ratios larger than 44 dB. The difference in their intensity is less than 1.2 dB. The dual-wavelength emission is observed at CW gain currents up to 350 mA with a highest optical power of 200.3 mW. Under gain-switching operation, using a 426-MHz sinusoidal signal superimposed on a DC bias current, stable dual-wavelength emission has been observed over wide DC bias current and temperature ranges of 50-250 mA and 10-45° C., respectively. Dual-wavelength average output power of 125.3 mW is achieved at 250 mA DC bias current. The intensity difference between two spectral peaks is less than 0.75 dB in the DC bias current range from 50 to 250 mA and the corresponding wavelength separation of about 1.35 nm is maintained over the entire operation range.

A comparative experiment has been performed for different configurations of inter-digital heaters on the same 0.5-mm long DBR section of a DBR laser and the experimental results are summarized in Table 1:

TABLE 1

Comparative Example of Heating Element Configuration Illustrated in FIG. 2.

| | | |
|---|---|---|
| Number of heating sections | 7 | 4 |
| Intra-grating spacing, d (µm) | 74 | 148 |
| Intra-grating gap, g (µm) | 37 | 104-110 |
| Laser chip thickness, b (µm) | 140-150 | 140-150 |
| Gain peak wavelength at 25° C. (nm) | 1055 | 1055 |
| DBR reflection peak wavelength at 25° C. (nm) | 1059.6 | 1059.6 |
| DBR reflection 3-dB bandwidth (nm) | 0.65 | 0.65 |
| Longitudinal modes within 3-dB bandwidth (nm) | 12 | 12 |
| Threshold gain current at 25° C. (mA) | 40 | 40 |
| Output power at 25° C. and 750 mA gain current (mW) | 466 | 466 |
| Maximum heater voltage (V) | 2 | 2 |
| Maximum DBR heating power (W) | 0.17 | 0.1 |
| Wavelength tuning range (nm) | 2.35 | 1.38 |
| DBR heater resistance* (Ohm) | 21.2 | 36.4 |
| Wavelength tuning efficiency* (nm/W) | 13.4 | 11.5 |
| Side-mode suppression ratio (dB) | 35-53** | 55** |
| Number of below-threshold reflection lobes | 3 | 5 |
| Number of observed lasing peaks | 1 | 2*** |
| Lasing peak wavelengths (nm) | — | 1059.5 and 1060.89 |
| Peak wavelength separation (nm) | — | 1.39 |
| Side-mode suppression ratio (dB) | — | >44 |
| Intensity difference between lasing peaks (dB) | — | 1.2 |

*At gain current of 500 mA.
**At 1-nm wavelength tuning.
***At 25° C. and 100 mA gain current.

Figure 3:
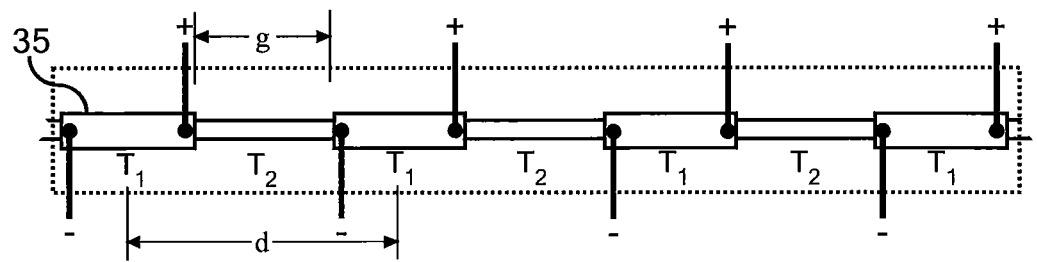
Figure 4:
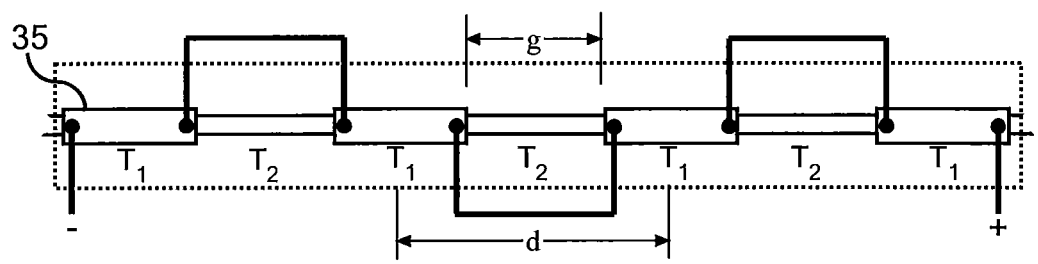

Interdigital heating elements with current flowing in the heavily-doped semiconductor contact layer or interdigital heating elements in the form of metal thin-film layer on the top of the waveguide can be used. As is noted above, FIG. 2 illustrates interdigital heating element control nodes configured for bi-directional heating current flow in individual ones of the DBR heating elements. In the embodiment of FIG. 2 and other similar embodiments, it is contemplated that the heating element control nodes associated with each heating element can be configured as a plurality of independent heating element circuits or can be connected in parallel in a common heating element circuit. Referring to FIG. 3, it is also contemplated that the DBR heating elements 35 can be configured for uni-directional heating current flow in individual ones of the DBR heating elements 35. Additionally, referring to FIG. 4, it is contemplated that the DBR heating elements 35 can be configured as a plurality of independent heating elements connected in series in a single heating element circuit or a plurality of independent heating element circuits.

Figure 5:
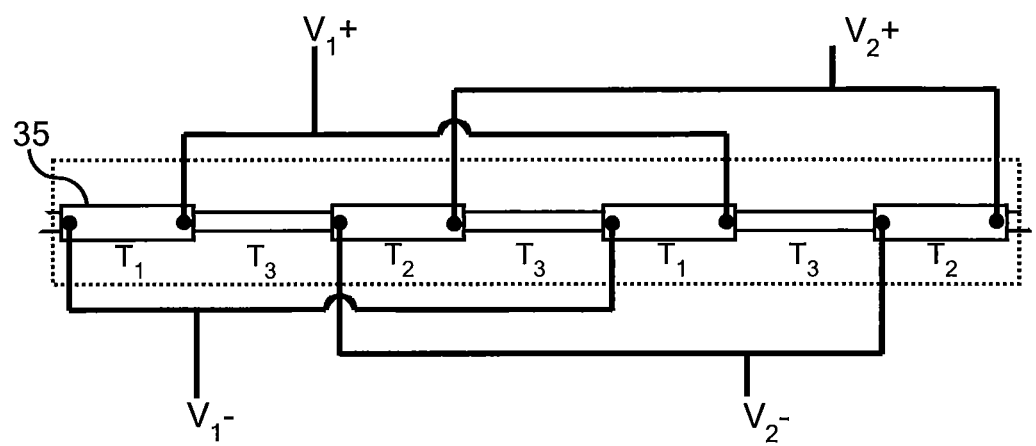

Finally, referring to FIG. 5, it is contemplated that the DBR heating elements 35 can be configured as a plurality of sets of independent heating elements tailored to generate two thermally active portions $T_1$, $T_2$ and one thermally passive grating portion $T_3$ and to generate more than two wavelengths. More specifically, in FIG. 5, the individual heating elements 35 are arranged in two sets of independent heating elements. The heating elements of each set are connected in series in a heating element circuit to define a plurality of independent heating element circuits to enable the generation of thermally active grating portions $T_1$, $T_2$ and thermally passive grating portions $T_3$.

Regardless of the particular heating element and control node configuration, it is contemplated that the thermally active grating portions and the thermally passive grating portions can be buried in an upper layer of the semiconductor laser below the DBR heating elements. It is also contemplated that the respective grating periods of the thermally active and thermally passive grating portions can be approximately equal or substantially different. In addition, it is contemplated that the respective grating periods of the thermally active and thermally passive grating portions can be in phase relative to each other or phase shifted relative to each other without departing from the scope of the present disclosure.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

The invention claimed is:

1. A multi-wavelength distributed Bragg reflector (DBR) semiconductor laser comprising a waveguide defining an axis of optical propagation, a wavelength selective DBR section, a plurality of DBR heating elements, a gain section, and a laser substrate, wherein:
   the axis of optical propagation of the waveguide extends between the front and rear facets of the laser diode and passes through the DBR section and the gain section of the laser;
   the DBR heating elements are positioned over the waveguide in the DBR section and are spaced in succession along the axis of optical propagation by an intra-grating spacing d to define one or more thermally active grating portions in the DBR section and one or more thermally passive grating portions in the DBR section;
   the thermally active grating portions define a temperature dependent Bragg wavelength that is a function of the grating period of the thermally active grating portions;
   the thermally passive grating portions define a temperature dependent Bragg wavelength that is a function of the grating period of the thermally passive grating portions;
   the waveguide and the laser substrate of the wavelength selective DBR section contribute to define the laser chip thickness b; and
   the intra-grating spacing d is approximately the same order of magnitude as the laser chip thickness b.

2. A semiconductor laser as claimed in claim 1 wherein the intra-grating spacing d is at least as large as the laser chip thickness b.

3. A semiconductor laser as claimed in claim 2 wherein the DBR heating elements are separated along the axis of optical propagation by an intra-grating gap g that is less than the laser chip thickness b and the intra-grating spacing d.

4. A semiconductor laser as claimed in claim 1 wherein the DBR heating elements are separated along the axis of optical propagation by an intra-grating gap g that is less than the laser chip thickness b and the intra-grating spacing d.

5. A semiconductor laser as claimed in claim 4 wherein the intra-grating gap g is approximately 70% to approximately 75% of the intra-grating spacing d.

6. A semiconductor laser as claimed in claim 1 wherein:
   the DBR heating elements are separated along the axis of optical propagation by an intra-grating gap g;
   the wavelength selective DBR section defines a DBR length of between approximately 0.5 mm and approximately 0.52 mm;
   the intra-grating spacing d is between approximately 148 µm and approximately 150 µm; and the intra-grating gap g is between approximately 104 μm and approximately 110 μm.

7. A semiconductor laser as claimed in claim 1 wherein the DBR heating elements are restricted to the DBR section.

8. A semiconductor laser as claimed in claim 1 wherein the DBR heating elements comprise interdigital heating element control nodes configured for bi-directional heating current flow in individual ones of the DBR heating elements.

9. A semiconductor laser as claimed in claim 1 wherein the DBR heating elements comprise heating element control nodes configured for uni-directional heating current flow in individual ones of the DBR heating elements.

10. A semiconductor laser as claimed in claim 1 wherein the DBR heating elements comprise heating element control nodes configured as a plurality of independent heating element circuits.

11. A semiconductor laser as claimed in claim 1 wherein the DBR heating elements are configured as a plurality of independent heating elements connected in parallel in one or more heating element circuits.

12. A semiconductor laser as claimed in claim 1 wherein the DBR heating elements are configured as a plurality of independent heating elements connected in series in one or more heating element circuits.

13. A semiconductor laser as claimed in claim 1 wherein:
the DBR heating elements are configured as a plurality of sets of independent heating elements; and
individual heating elements of each set of independent heating elements are connected in series in a heating element circuit to define a plurality of independent heating element circuits.

14. A semiconductor laser as claimed in claim 1 wherein the thermally active grating portions and the thermally passive grating portions are buried in an upper layer of the laser below the DBR heating elements.

15. A semiconductor laser as claimed in claim 1 wherein the respective grating periods of the thermally active and thermally passive grating portions are approximately equal.

16. A semiconductor laser as claimed in claim 1 wherein the respective grating periods of the thermally active and thermally passive grating portions are substantially different.

17. A semiconductor laser as claimed in claim 1 wherein the respective grating periods of the thermally active and thermally passive grating portions are in phase relative to each other.

18. A semiconductor laser as claimed in claim 1 wherein the respective grating periods of the thermally active and thermally passive grating portions are phase shifted relative to each other.

19. A multi-wavelength distributed Bragg reflector (DBR) laser comprising a waveguide defining an axis of optical propagation, a wavelength selective DBR section, a plurality of DBR heating elements, a gain section, and a laser substrate, wherein:

the axis of optical propagation of the waveguide extends between the front and rear facets of the laser diode and passes through the DBR section and the gain section of the laser;

the DBR heating elements are positioned over the waveguide in the DBR section and are spaced in succession along the axis of optical propagation by an intra-grating spacing d to define one or more thermally active grating portions in the DBR section and one or more thermally passive grating portions in the DBR section;

the thermally active grating portions define a temperature dependent Bragg wavelength that is a function of the grating period of the thermally active grating portions;

the thermally passive grating portions define a temperature dependent Bragg wavelength that is a function of the grating period of the thermally passive grating portions;

the thermally active grating portions and the thermally passive grating portions are buried in an upper layer of the laser below the DBR heating elements;

the waveguide and the laser substrate of the wavelength selective DBR section contribute to define the laser chip thickness b;

the intra-grating spacing d is at least as large as the laser chip thickness b;

the DBR heating elements are separated along the axis of optical propagation by an intra-grating gap g that is less than the laser chip thickness b and the intra-grating spacing d.

20. A multi-wavelength distributed Bragg reflector (DBR) semiconductor laser comprising a waveguide defining an axis of optical propagation, a wavelength selective DBR section, a plurality of DBR heating elements, a gain section, and a laser substrate, wherein:

the axis of optical propagation of the waveguide extends between the front and rear facets of the laser diode and passes through the DBR section and the gain section of the laser;

the DBR heating elements are positioned over the waveguide in the DBR section and define an interleaved temperature profile that generates multiple distinct reflection peaks corresponding to distinct temperature dependent Bragg wavelengths associated with the temperature profile;

the waveguide and the laser substrate of the wavelength selective DBR section contribute to define laser chip thickness b; and neighboring pairs of heating elements of the DBR heating elements positioned over the waveguide in the DBR section are spaced along the direction of the axis of optical propagation by a distance that is equal to or greater than the laser chip thickness b to minimize the impact of thermal crosstalk between distinct temperature regions of the interleaved temperature profile.

* * * * *